(12) United States Patent
Loke et al.

(10) Patent No.: US 6,615,028 B1
(45) Date of Patent: Sep. 2, 2003

(54) SYSTEM AND METHOD FOR SELECTING AMPLIFIERS IN A COMMUNICATIONS DEVICE

(75) Inventors: Aravind Loke, Irvine, CA (US); Mohy F. Abdelgany, Irvine, CA (US); James F. Kamke, Riverside, IL (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/222,063

(22) Filed: Dec. 29, 1998

(51) Int. Cl.[7] ............................................... H01Q 11/12
(52) U.S. Cl. ........................................ 455/127; 455/102
(58) Field of Search ........................... 455/92, 114, 115, 455/102, 103, 126, 127; 330/124 R, 51

(56) References Cited

U.S. PATENT DOCUMENTS

| | | | | |
|---|---|---|---|---|
| 5,561,395 A | * | 10/1996 | Melton et al. .................. 330/2 |
| 5,758,269 A | * | 5/1998 | Wu .............................. 455/127 |
| 5,872,481 A | * | 2/1999 | Sevic et al. ..................... 330/51 |
| 5,903,854 A | * | 5/1999 | Abe et al. ..................... 455/575 |
| 5,974,041 A | * | 10/1999 | Kornfeld et al. ............ 370/342 |
| 6,069,525 A | * | 5/2000 | Sevic et al. ..................... 330/51 |
| 6,091,966 A | * | 7/2000 | Meadows .................... 455/553 |
| 6,181,208 B1 | * | 1/2001 | King et al. ................... 330/295 |
| 6,215,987 B1 | * | 4/2001 | Fujita ......................... 455/127 |

OTHER PUBLICATIONS

Data Sheet of RI 23107U Personal Communication Services (PCS) Power Amplifier (1850–1910 MHz); Rockwell Semiconductor Systems, Aug. 25, 1998.
TIA/EIA Engineering Standards Proposal No. 3815 for ANSI/TIA/EIA–98B; Published by ©Telecommunications Industry Association 1997.

* cited by examiner

*Primary Examiner*—Lester G. Kincaid
*Assistant Examiner*—N. Mehrpour
(74) *Attorney, Agent, or Firm*—Knobbe, Martens, Olson & Bear LLP.

(57) ABSTRACT

A communications device includes an amplifier module configured to amplify a signal. The amplifier module includes a parallel arrangement of amplifiers each designed to operate with increased efficiency for different power level ranges. A controllable switch selectively interconnects the power amplifiers. A controller in communication with the controllable switch selectively interconnects the power amplifiers to increase the efficiency of the amplifier module.

46 Claims, 6 Drawing Sheets

SYSTEM AND METHOD FOR SELECTING AMPLIFIERS IN A COMMUNICATIONS DEVICE

BACKGROUND OF THE INVENTION

1. Field of the Invention

The invention generally relates to electronic devices. More particularly, the invention relates to a communications device and a transmitter included therein.

2. Background

There is an ever present need to reduce the power consumption of electronic devices. For example, a laptop computer or a wireless phone typically includes a battery to store and provide electrical energy for the operation of the electronic device. A user can operate the electronic device through the battery when no other source of electrical energy is available, or when the user wants to be mobile. Batteries, however, store only a limited amount of electrical energy, which is consumed by the electronic device.

The batteries, thus, have to be recharged after the electronic device has been used for a certain time. The time interval between two subsequent charging events is expressed as operating time. In wireless phones, for example, the operating time can further be divided into a stand-by time and a talk time.

The user of a wireless communications device such as a mobile unit or a cellular phone typically desires to have an operating time, particularly a talk time, which is as long as possible. Additionally, the user generally expects the wireless device to be as small and as light as possible. Because the operating time is dependent from the capacity and, thus, usually from the size of the battery, small size, low weight, long operating time of the wireless device are often contradictory expectations.

To fulfill these expectations, manufacturers seek to increase the capacity of the batteries without increasing the size and weight of the batteries. In addition, manufacturers of wireless devices have developed wireless devices which operate at lower voltages, for example 3.3 volts, to increase the stand-by time and the talk time.

SUMMARY OF THE INVENTION

One embodiment of the invention relates to a communications device which includes an amplifier module configured to amplify a signal. The amplifier module includes a parallel arrangement of amplifiers each designed for a specific power level range. A controllable switch selectively interconnects the power amplifiers. A controller in communication with the controllable switch selectively interconnects the power amplifiers based on the operating parameters of the communications device.

The transmit power of a communications device typically varies depending on the transmit conditions, the proximity of the communications device to a base station, etc. For example, a communications device may transmit at maximum power when poor transmit conditions exist. In many devices, the output power amplifier is optimized to generate the maximum power output.

If the transmit conditions are favorable or if a communications device is near a base station, the communications device often transmits at less than the maximum output power. Statistically speaking, a communications device typically sends most of its operational life transmitting at less than maximum power. For example, in a code division multiple access (CDMA) cellular phone, most of the time the phone operates below the maximum power output level within a range from about −5 dBM (measured decibels referenced to a power of 1 milliwatt) to about +8 dBm. Accordingly, one embodiment of the invention increases the output power efficiency when an electronic device operates at a lower output power level.

Another embodiment of the invention relates to a wireless communications device comprising a modulator module that is configured to convert a baseband signal to a radio frequency signal. The wireless communications device also comprises an amplifier module which receives the radio signal and generates an amplified output signal.

The amplifier module comprises a first amplifier in communication with the radio frequency signal. The first amplifier is configured to generate a first amplified signal at increased efficiency in a first operational range.

The amplifier module also comprises a second amplifier in communication with the radio frequency signal. The second amplifier is arranged in parallel with the first amplifier. The second amplifier is configured to generate a second amplified signal at increased efficiency in a second operational range, wherein the second operational range is different than the first amplification range.

The amplifier module also comprises a third amplifier in communication with the radio frequency signal. The third amplifier is arranged in parallel with the first and second amplifiers. The third amplifier is configured to generate a third amplified signal at increased efficiency in a third operational range, wherein the third operational range is different than the first and second operational ranges.

The amplifier module further comprises a switch in communication with the first, second and third amplifiers. The switch is configured to select the first, second or third amplified signal as the amplified output signal.

The wireless communications device further comprises a control module in communication with the switch. The control module is configured to control the switch based on a desired operational level.

In one embodiment, for example, the first operational range is between 29 dBm and 19 dBm. The second operational range is between 20 dBm and 9 dBm. Third operational range between 10 dBm and −1 dBm.

In another embodiment, the wireless communications device further comprises a selector that selectively enables the first, second or third amplifiers. In another embodiment, the selector receives a digital control value. In yet another embodiment, the control value identifies at least one of the first, second or third amplifiers. In an additional embodiment, the first amplifier farther comprises two serially-connected amplifiers.

Another embodiment of the invention relates to an amplification module comprising an input for receiving an input signal. The amplification module further comprising at least a first amplifier in communication with the input. The first amplifier is configured to amplify the input signal to generate a first amplified signal at increased efficiency within a first operational range.

The amplification module further comprising at least a second amplifier in communication with the input. The second amplifier is configured amplify the input signal to generate a second amplified signal at increased efficiency in a second operational range, wherein the second operational range is different than the first operational range.

The amplification module further comprising a switch in communication with the first and second amplifiers, the switch configured to output at least one of the first and second amplified signals as an amplified output signal.

In one embodiment, the first and second amplifiers are configured to be selectively activated. In another embodiment, the first amplifier operates in an operational range between 29 dBm and 19 dBm. The second amplifier operates in an operational range between 20 dBm and 9 dBm.

In one embodiment, the switch selects either the first or second amplified signal. In another embodiment, the switch combines the first and second amplified signals. In yet another embodiment, the amplification module further comprises a selector that is configured to at least enable or disable at least one of the first or second amplifiers.

In an additional embodiment, the amplification module further comprises at least a third amplifier in communication with the input. The third amplifier configured to amplify the input signal to generate a third amplified signal at increased efficiency in a third operational range, wherein the third operational range is different than the first and second operational ranges.

Another embodiment of the invention relates to an amplifier circuit comprising an input for receiving an input signal. The amplifier circuit further comprises at least a first amplifier in communication with the input. The first amplifier configured to amplify the input signal to generate a first amplified signal at increased efficiency within a first operational range.

The amplifier circuit further comprising at least a second amplifier in communication with the input. The second amplifier configured amplify the input signal to generate a second amplified signal at increased efficiency within a second operational range.

The amplifier circuit further comprising a selector in communication with the first and second amplifiers. The selector configured to enable at least one of the first and second amplifiers so as to generate an amplified output signal.

In one embodiment, the input signal is approximately 800 megahertz. In another embodiment, the input signal is approximately 1900 megahertz. In yet another embodiment, the amplified output signal is a wireless communications signal. In additional embodiment, the amplified output signal is a cellular communications signal.

In one embodiment, the amplified output signal is a Global System for Mobile Communications (GSM) communications signal. In another embodiment, the amplified output signal is a Personal Communications System (PCS) communications signal. In yet another embodiment, the amplified output signal is an Advanced Mobile Phone Systems (AMPS) communications signal.

Another embodiment of the invention relates to an amplifier circuit comprising a first means for amplifying an input signal to generate a first amplified signal at increased efficiency within a first operational range. The amplifier circuit further comprising a second means arranged generally parallel with the first means. The second means for amplifying the input signal to generate a second amplified signal at increased efficiency within a second operational range. The amplifier circuit further comprising a third means for selectively enabling the output of at least one of the first or second amplified signals.

In one embodiment, the amplifier circuit further comprises a fourth means for selectively enabling at least one of the first or second amplifiers. In another embodiment, the amplifier circuit further comprises a fifth means for controlling the fourth means. The fifth means enables at least one of the first and second amplifiers based on a desired operational range.

Another embodiment of the invention relates to a method of operating a wireless communications device comprising the acts of converting a baseband signal to a radio frequency signal and amplifying with a first amplifier, the radio frequency signal at increased efficiency in a first operational range to produce a first amplified signal. The method further comprising the act of amplifying with a second amplifier, the radio frequency signal at increased efficiency in a second operational range to produce a second amplified signal, wherein the second operational range is different than the first amplification range.

The method further comprising the act of amplifying with a third amplifier, the radio frequency signal at increased efficiency in a third operational range to produce a third amplified signal, wherein the third operational range is different than the first and second operational ranges. The method further comprising the act of selectively outputting based on a desired operational level, the first, second or third amplified signals as an amplified output signal.

In one embodiment, the first operational range is between 29 dBm and 19 dBm. The second operational range is between 20 dBm and 9 dBm. The third operational range is between 10 dBm and −1 dBm.

In one embodiment, the method further comprises the act of selectively activating the first, second or third amplifier. In another embodiment, the method further comprises the act of processing a digital control value to selectively activate the first, second or third amplifier. In an additional embodiment, method further comprises the act of processing the first amplified signal with a fourth amplifier to generate a modified first amplified signal.

Another embodiment of the invention relates to method of amplifying an input signal comprising the acts of receiving an input signal and amplifying the input signal with a first amplifier to generate a first amplified signal at increased efficiency within a first operational range. The method further comprising the act of amplifying the input signal with a second amplifier to generate a second amplified signal at increased efficiency in a second operational range, wherein the second operational range is different than the first operational range.

The method further comprising the act of selectively enabling the output of at least one of the first and second amplified signals in response to a desired operational level.

In one embodiment, the method further comprises the act of selectively activating at least one of the first and second amplifiers. The first operational range is between 29 dBm and 19 dBm. The second operational range is between 20 dBm and 9 dBm.

In another embodiment, the act of selectively enabling selects either the first or second amplified signal. In yet another embodiment, the act of selectively enabling combines the first and second amplified signals.

Another embodiment of the invention relates to a method of amplifying an input signal comprising the act of amplifying with a first amplifier an input signal to generate a first amplified signal at increased efficiency within a first operational range. The method further comprising the act of amplifying with a second amplifier the input signal to generate a second amplified signal at increased efficiency within a second operational range. The method further comprising the act of selecting at least one of the first and second amplified signals so as to generate an amplified output signal.

In one embodiment, the input signal is approximately 800 megahertz. In another embodiment, the input signal is approximately 1900 megahertz. In yet another embodiment, the amplified output signal is a wireless communications signal. In an additional embodiment, the amplified output signal is a cellular communications signal.

In one embodiment, the amplified output signal is a GSM communications signal. In another embodiment, the amplified output signal is a PCS communications signal. In yet another embodiment, the amplified output signal is an AMPS communications signal.

BRIEF DESCRIPTION OF THE DRAWINGS

These and other aspects, advantages, and novel features of the invention will become apparent upon reading the following detailed description and upon reference to the accompanying drawings.

DETAILED DESCRIPTION OF THE PREFERRED EMBODIMENTS

Figure 1:
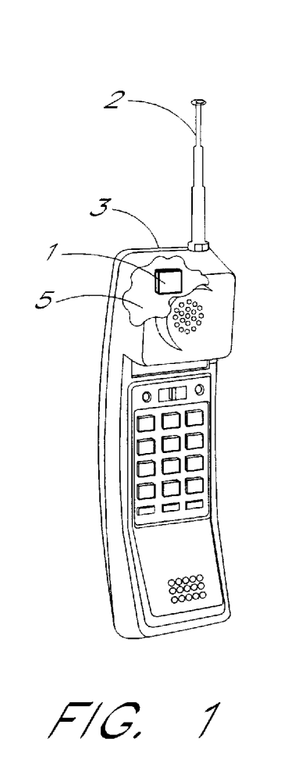
FIG. 1 is a schematic illustration of a wireless communications device cut away to show a portion of the motherboard.

FIG. 1 shows a wireless communications device 3 as an example for an electronic device. Other examples of electronic devices include wireless phones, cordless phones, mobile transmitters, stationary wireless transmitters, personal digital assistants, wireless modems, pagers, wireless fax machines, and other battery operated devices. It is contemplated that the invention is also applicable to a wide range of non-portable electronic devices such as modems, cable modems, fax machines, base stations, land-line based applications, computer network applications and the like. Further, it is contemplated that the invention is generally applicable to a wide range of battery operated devices. Hereinafter, one embodiment of the invention is described with reference to a cellular phone which is one embodiment of the wireless communications device 3.

The cellular phone operates within a mobile communications system. A mobile communications system, for example a code division multiple access (CDMA) system, is structured to have a variety of individual regions called cells, and to comprise a variety of fixed transceiver stations called base transceiver stations, and a plurality of mobile stations, the cellular phones. Usually, one base transceiver station defines one cell and handles telephone traffic to and from the cellular phones which are currently located in the cell.

The wireless communications device 3 is exemplary described as, but not limited to, a wireless phone for a CDMA system. Hereinafter, the wireless communications device 3 is referred to as the phone 3. A portion of the case of the phone 3 is cut away to show a motherboard 5 of the phone 3 with a transmitter module 1 positioned thereon. Although not shown in FIG. 1, those skilled in the art will appreciate that the phone 3 comprises a plurality of other components and functional modules, such as the components included in a receive path and a transmit path. For example, the phone 3 further includes a central processing unit (CPU), an antenna 2, a display and a keypad.

In one embodiment, the transmitter module 1 is configured to emit radio frequency (RF) signals. The transmitter module 1 comprises an amplifier stage for amplifying the RF signals according to electrical characteristics such as a defined nominal effective radiated power (ERP). In cellular CDMA systems, the phones are grouped into three categories Class I, Class II and Class III having different ranges of effective radiated powers. For example, a Class I phone emits an effective radiated power of 1.25 watts to 6.3 watts and a Class III phone emits an effective radiated power of 0.2 watts to 1 watt. Further electrical characteristics are described in TIA/EIA/IS-98A, for example, in Table 10.4.5.3-1.

Regarding operation, it is contemplated that the phone 3 can operate for systems that use the code division multiple access (CDMA), frequency division multiple access (FDMA), and time division multiple access (TDMA) standards. Furthermore, it is contemplated that the phone 3 can operate in frequency bands used for wireless communications. For example, the phone 3 can be configured to receive and transmit data according to the Global System for Mobile Communications (GSM) standard which typically operates in the 900 MHz and 1800 MHz ranges.

Furthermore, the phone 3 can be configured to receive and transmit data according to the Personal Communications System (PCS) standard. In PCS systems, the phone 3 operates in a transmit band between 1850 MHz and 1910 MHz and a receive band between 1930 MHz and 1990 MHz. The phone 3 can also be configured to receive and transmit data according to the Advanced Mobile Phone Systems (AMPS) standard. In an AMPS system, the phone 3 operates in a transmit band between 824 MHz and 849 MHz and a receive band between 869 MHz and 894 MHz.

In addition, it is contemplated that in one embodiment, the phone 3 can be configured to operate as a dual-band phone and as a dual-mode phone. For example, the phone 3 can be configured to include a dual-band transmitter so that the phone 3 can operate both in the CDMA frequency bands and PCS frequency bands. In addition, the phone 3 can be configured as a dual-mode phone to operate in the CDMA mode or in a mode for AMPS communication devices.

Figure 2:
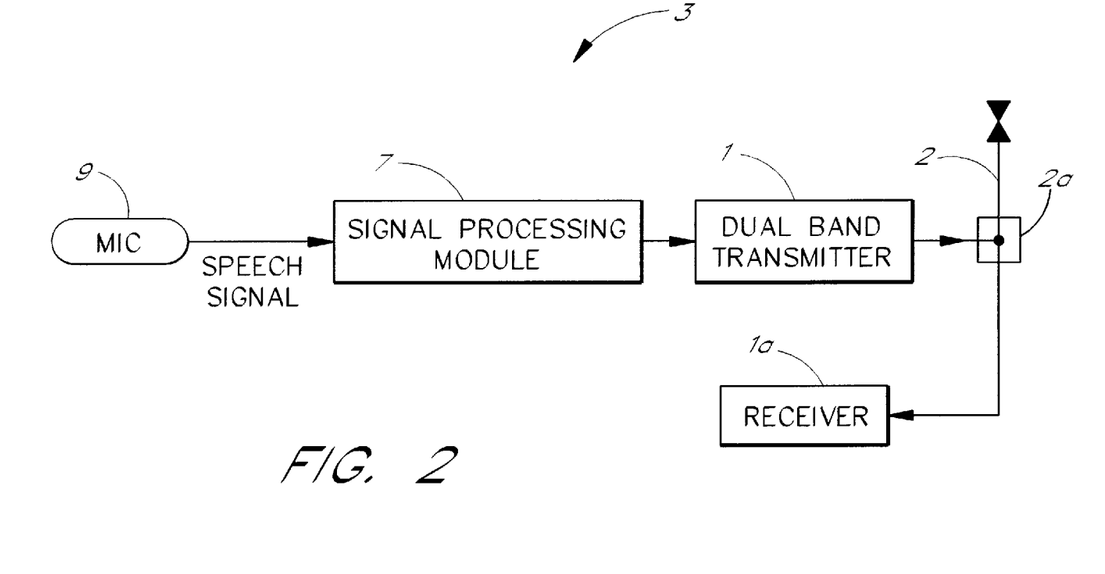
FIG. 2 is an illustration of one embodiment of a transmit path within the wireless communications device shown in FIG. 1.

FIG. 2 illustrates an embodiment of the transmit path of the phone 3. Within the cellular phone 3, the transmitter module 1 and a processing module 7 are positioned on the motherboard 5 and interconnected between the antenna 2 and a microphone 9 of the phone 3. In the illustrated embodiment, the processing module 7 performs most speech and signal processing in a transmit direction, for example, voice encoding and channel encoding. A modulator, included either in the signal processing module 7 or the transmitter module 1, modulates a RF carrier of, for example, about 824 MHz with the processed speech signal. The carrier frequency of 824 MHz is selected from a transmit band defined for CDMA systems. The transmit band is approximately between 824 MHz and 849 MHz. For PCS systems, the RF carrier is selected from the transmit band between 1850 MHz and 1910 MHz as discussed above.

The receive path is indicated by means of a receiver module 1a which includes, for example, a radio frequency (RF) receiver. The transmitter module 1 and the receiver module 1a are connected to the antenna 2 through an electronic switch 2a which connects the antenna 2 either to the transmitter module 1 or the receiver module 1a. The CPU of the phone 3 operates the electronic switch 2a in accordance with a transmission protocol to avoid, for example, that the receiver 1a receives a signal the transmitter module 1 emits. In cellular CDMA systems, for example, a duplexer ensures that the receiver 1a does not receive the signal emitted from the transmitter module 1.

Figure 3:
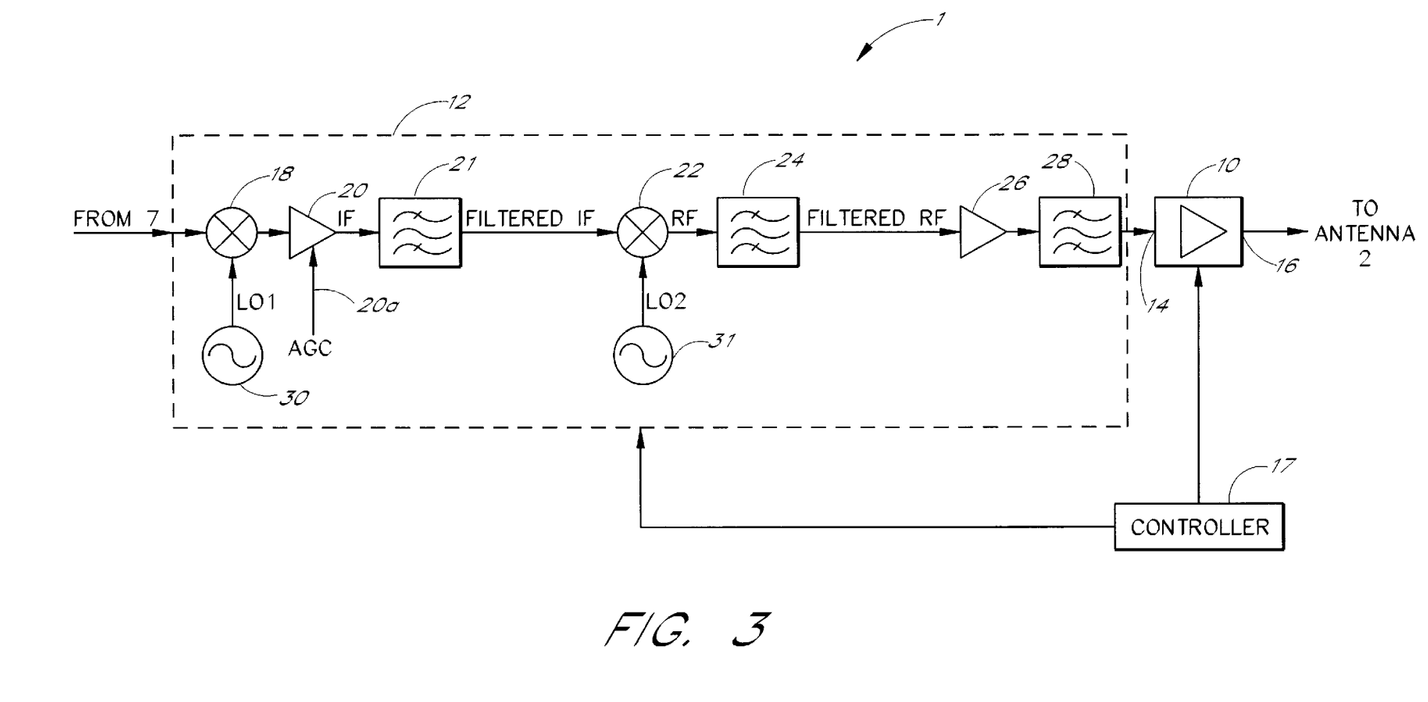
FIG. 3 is a schematic illustration of a first embodiment of a transmitter.

FIG. 3 shows an exemplary block diagram of the transmitter module 1 shown in FIG. 2. Electrical circuits or devices such as the receiver module 1a and the transmitter module 1 can be implemented in a single-ended version or a differential version. The differential version is advantageously used to improve the electrical circuits with respect to noise and undesired signal components. In the differential version, the transmitter module 1 is connected to the signal processing module 7 through two differential lines. The differential lines are typically referred to as inverted and non-inverted, or "+" and "−". The block diagram of FIG. 3, however, shows the transmitter module 1 in the single-ended version. Those skilled in the art will appreciate that a differential version can be implemented by adapting the components to receive, process and output signals on two lines.

The transmitter module 1 includes a modulator module 12 and an amplifier module 10. The modulator module 12 is connected between the signal processing module 7 and the amplifier module 10. The modulator module 12 includes mixer and driver stages as described below. In one embodiment, the amplifier module 10 is a multiple-stage amplifier operating as a power amplifier. An input 14 of the amplifier module 10 is connected to the modulator module 12 and an output 16 of the amplifier module 10 is connected to the antenna 2.

A controller 17 located within the phone 3 controls and monitors the modulator module 12 and the amplifier module 10. For instance, the controller 17 can be associated with a power management system of the phone 3. The power management system is responsible for controlling the power level with which the RF signals are transmitted. The power level depends, for example, on the distance between the phone 3 and a base transceiver station, and the characteristics of a propagation path between the phone 3 and the base transceiver station. The power level requirements are transmitted between the phone 3 and the base transceiver station by means of a communications protocol typically used in CDMA systems. The controller 17 can be the central processing unit (CPU) of the phone 3 or a subprocessor in communication with the CPU. In one embodiment, the power management system is implemented in a subprocessor which communicates with the CPU.

The modulator module 12 of the transmitter module 1 includes two mixer stages formed by mixers 18, 22 in combination with local oscillators 30, 31 respectively. In FIG. 3, the local oscillators 30, 31 are shown as being part of the modulator module 12. However, it is contemplated that the local oscillators 30, 31 can be located at other locations within the phone 3. Further, it is contemplated that the grouping into the modulator module 12 and the amplifier module 10 is arbitrarily and that this grouping is for descriptive purposes only.

The mixer 18 is configured as a QPSK modulator (Quadrature Phase Shift Keying) which receives "I" and "Q" components of a baseband signal from the signal processing module 7 and a signal LO1 from the local oscillator 30. In one embodiment, the local oscillator 30 is adjustable so that the signal LO1 has a frequency in a range of about 100 to 640 MHz. The mixer 18 (QPSK modulator) modulates the signal LO1 with the incoming baseband signal so that an intermediate frequency signal results (indicated as "IF" and hereinafter referred to as IF signal). The IF signal includes the desired intermediate frequency, but also undesired frequencies which may cause noise in the IF signal. The IF signal is fed to an amplifier 20 which is controlled by a control signal AGC generated by the controller 17. The controller 17 is connected to the amplifier 20 via a control line 20a.

The amplifier 20 is configured to have a variable gain which is adjusted by the control signal AGC thereby implementing an automatic gain controlled amplifier. In one embodiment, the amplifier 20 has a dynamic range of about 90 dB and the control signal AGC can have a DC voltage between 0.2 V and 2.5 V to control the gain of the amplifier 20.

The amplifier 20 outputs an amplified IF signal to a bandpass filter 21. The bandpass filter 21 has a filter characteristic selected to pass the intermediate frequency and to block the undesired frequencies to reduce noise in the IF signal. In one embodiment, the bandpass filter 21 has a passband of about +/−650 kHz. In FIG. 3, the output of the bandpass filter 21 is indicated as "Filtered IF."

The noise reduced IF signal is fed to the mixer 22. In one embodiment, the mixer 22 can be configured to have a controlled gain variation to calibrate and to compensate for any gain variation in the transmit path. The mixer 22 converts the IF signal to a RF signal using a signal LO2 generated by the local oscillator 31. In one embodiment, the signal LO2 has a frequency of about 955 MHz to 979 MHz. Similar to the mixer 18, the mixer 22 up-converts the IF signal and generates the RF signal comprising the desired radio frequency, but also undesired frequencies. The output of the mixer 22 is indicated as "RF."

The RF signal is fed to a bandpass filter 24. The bandpass filter 24 has a filter characteristic selected to pass the desired radio frequency and to block the undesired frequencies to reduce noise in the RF signal. In one embodiment, the bandpass filter 24 has a passband of about 25 MHz. In FIG. 3, the output of the bandpass filter 21 is indicated as "Filtered RF."

The filtered RF signal is fed to an amplifier 26 which is generally configured to amplify RF signals in the 800 MHz range. The amplifier 26 is a drive amplifier for the amplifier module 10. Because an amplifier may not be ideally linear, the amplifier 20 can add undesired frequency components to the RF signal. To eliminate these undesired frequency components from the RF signal, an optional bandpass filter 28 is connected between the amplifier 20 and the amplifier module 10.

In FIG. 3, the bandpass filter 28 is connected to the input 14 of the amplifier module 10 which amplifies the RF signal. The amplifier module 10 outputs the amplified RF signal at the output 16 connected to the antenna 2. The antenna 2 emits the RF signal in a conventional manner.

Figure 4:
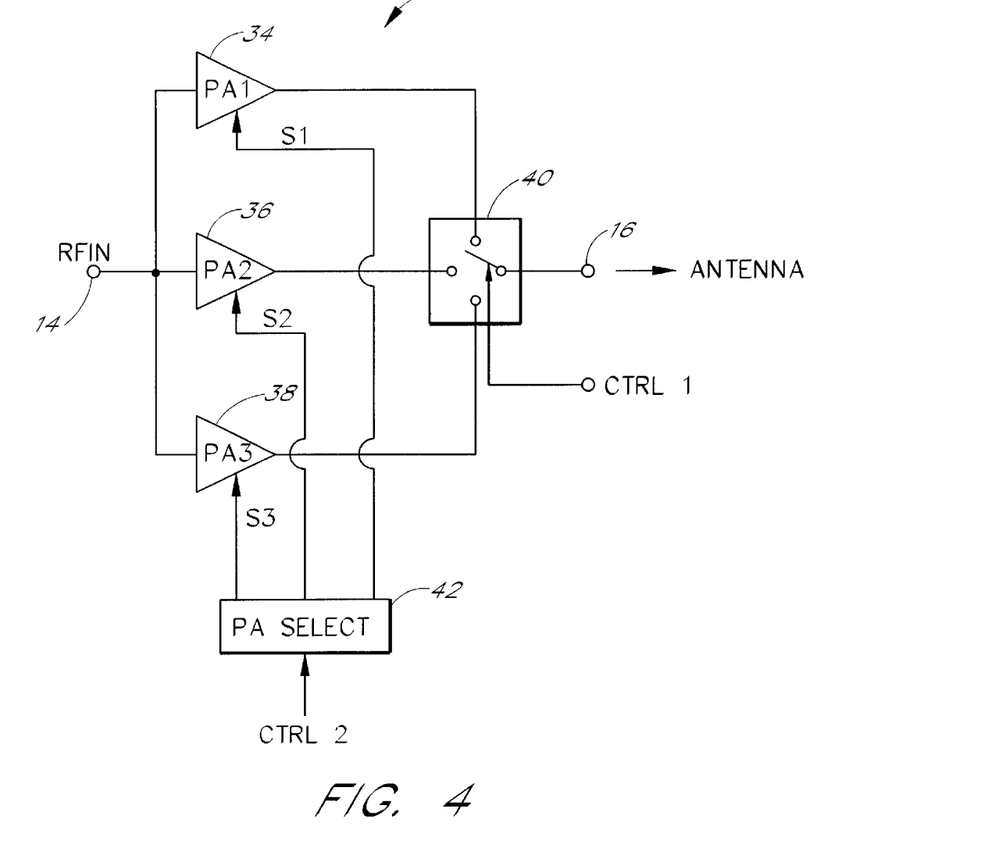
FIG. 4 is a schematic illustration of a transmitter module.

FIG. 4 shows an exemplary block diagram of the amplifier module 10. In the illustrated embodiment, the amplifier module 10 includes three amplifiers (PA1, PA2, PA3) 34, 36, 38 that are selectively interconnected. In one embodiment, the amplifiers 34, 36, 38 are power amplifiers, which are designed to amplify signals at increased efficiency within predetermined power levels in the radio frequency range.

The amplifiers 34, 36, 38 are hereinafter referred to as the power amplifiers 34, 36, 38. However, it is contemplated that the invention can be used widely in connection with a variety of different types of amplifiers and that the invention is not limited to applications using power amplifiers.

As shown in FIG. 4, inputs of the power amplifiers 34, 36, 38 are connected to the (common) input 14 (RFIN) and outputs of the power amplifiers 34, 36, 38 are connected to a switch 40. In the illustrated embodiment, the switch 40 connects the first power amplifier 34 to the output 16 and, thus, to the antenna 2. The switch 40 is shown as a three-pole switch. The switch 40 generally performs a controlled switching function to select one of three switching states. It is contemplated that the switch 40 can be implemented as a hardware switch, such as a relay, a diode switch, a gallium arsenide field-effect transistor or the like. The switch can be a discrete component, integrated as part of a monolithic microwave integrated circuit (MMIC), part of a radio frequency (RF) hybrid, or implemented with a wide variety of semiconductor fabrication techniques. In other embodiments, the switching function can be implemented by means of software routines and the like.

Each power amplifier 34, 36, 38 is controllable through control signals S1, S2, S3, respectively. The control signals S1, S2, S3 originate from a selector 42, illustrated as "PA Select," which receives a control signal CTRL2. The switch 40 is controllable through a control signal CTRL1 to connect one of the power amplifiers 34, 36, 38 to the output 16 and, thus, to the antenna 2.

The control signals CTRL1, CTRL2 are, for example, generated by the controller 17. In one embodiment, the control signal CTRL2 can be a two-bit word which allows to address up to four power amplifiers. Alternatively, the power amplifiers 34, 36, 38 can be directly connected to the controller 14 which outputs the control signals S1, S2, S3.

Each power amplifier 34, 36, 38 is configured to be activated by the corresponding control signal S1, S2, S3. For instance, the power amplifiers 34, 36, 38 can be activated by providing the supply voltage VCC to the power amplifiers 34, 36, 38, or by fully activating an already partially powered-up power amplifier 34, 36, 38.

Figure 5:
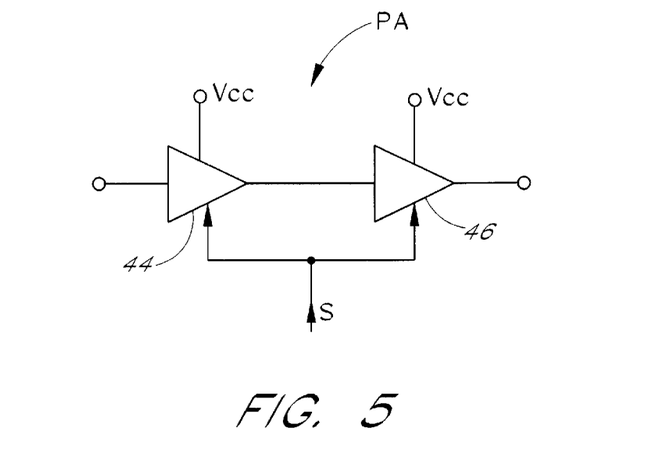
FIG. 5 is a schematic illustration of a power amplifier included in the amplifier module shown in FIG. 4.

FIG. 5 schematically shows an internal structure of the power amplifiers 34, 36, 38. The power amplifiers 34, 36, 38 generally include a serial arrangement of two amplifiers 44, 46. Each amplifier 44, 46 is connected to the supply voltage VCC. In operation, the power amplifiers 34, 36, 38 consume electrical power which is proportional to the consumed current. The consumed current is an accurate indicator of the consumed power and the power efficiency. For a specific power amplifier, the power efficiency generally increases with increasing output power, as shown in FIG. 6.

Figure 6:
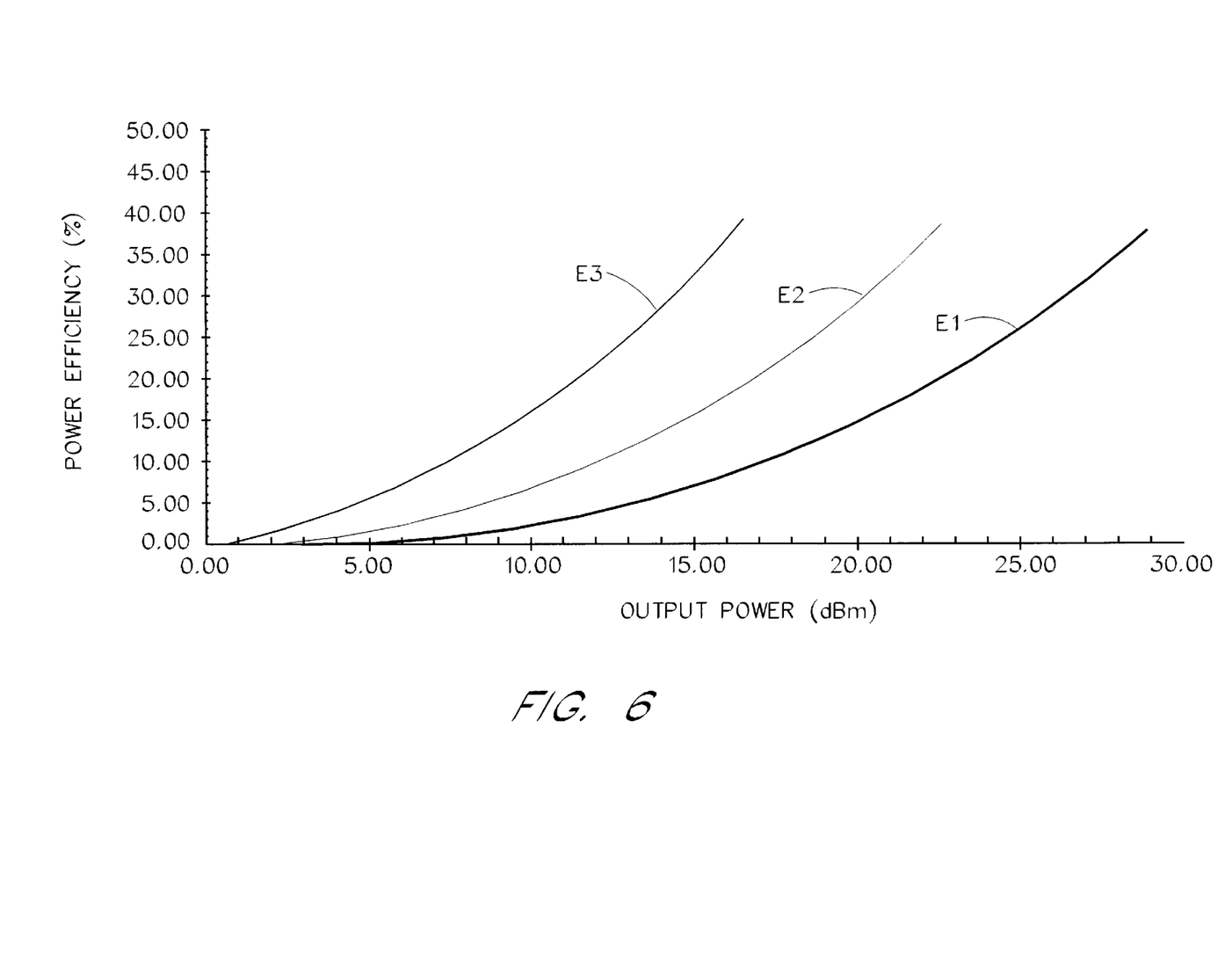
FIG. 6 shows graphs illustrating power efficiencies of three power amplifiers.

FIG. 6 shows exemplary graphs, labeled as E1, E2, E3, illustrating power efficiencies of the power amplifiers 34, 36, 38, respectively. The power efficiencies (in %) are shown as functions of the output power (in dBm, referenced to a power of 1 mW). It is contemplated that the graphs E1, E2, E3 are representations of a variety of possible graphs, and that the graphs E1, E2, E3 are shown to explain an underlying principle of the invention.

As shown, the power efficiency generally increases with an increasing output power. For example, the first power amplifier 34 has a power efficiency of about 15% at an output power of 20 dBm (graph E1). In case the output power is increased to about 25 dBm, the power efficiency increases to about 30%. The power efficiencies of the power amplifiers 36, 38 have similar characteristics. The second power amplifier 36 has a power efficiency of about 15% at an output power of 15 dBm (graph E2). In case the output power is increased to about 20 dBm, the power efficiency increases to about 30%. The third power amplifier 38 has a power efficiency of about 15% at an output power of 10 dBm (graph E3). In case the output power is increased to about 15 dBm, the power efficiency increases to about 30%.

If in one embodiment the first power amplifier 34 is active and connected to the antenna 2, the amplifier module 10 has a power efficiency as described by the graph E1. If the switch 40 is controlled to disconnect the first power amplifier 34 and to connect the second power amplifier 36 to the antenna 2, the amplifier module 10 has a power efficiency as described by the graph E2. The third power amplifier 38 is connectable to the antenna 2 in a similar manner.

As described above, the output power of the phone 3 is determined, inter alia, by the distance between the phone 3 and a transceiver station. For instance, in one embodiment, the amplifier module 10 initially amplifies the RF signal with the first amplifier 34 so that the RF signal has an output power of 25 dBm. The power efficiency is in this case about 30% (graph E1). If the output power of the phone 3 is reduced, for example, because the phone 3 moved closer to the transceiver station, the controller 17 initiates a reduction of the output power, for example, to about 20 dBm. As a consequence thereof, the power efficiency drops to about 15%.

To counteract this drop, the controller 17 activates one of the power amplifiers 36, 38 and connects the activated power amplifier 36, 38 to the antenna 2. The selection is based on data identifying which power amplifier 34, 36, 38 is best adapted for a specific range of output power. For instance, if the controller 17 connects the second power amplifier 36, 38 to the antenna 2, the amplifier module 10 has at the output power of 20 dBm a power efficiency of 30% (graph E2).

Similar, if the output power is further reduced, for example, to 15 dBm, the controller 17 again selects the power amplifier which is adapted for this range of output power. At the reduced output power of 15 dBm, the amplifier module 10 has, with the third power amplifier 38 being activated, again, a power efficiency of about 30%.

The described embodiment of the amplifier module 10 dynamically adapts to changing output power requirements to achieve an improved power efficiency over a wide range of output power. The improved power efficiency improves the operating time of the wireless communications device.

Referring to FIGS. 4–6, the amplifier module 10 provides for increased efficiency of the phone 3 which allows to improve, for example, the stand-by time and the talk time. Each power amplifier 34, 36, 38 is designed to operate with increased efficiency for a specific range of output power. For example, in one embodiment the power amplifier 34 operates more efficiently for a power range between 29 dBm and 19 dBm, the power amplifier 36 operates more efficiently for a power range between 20 dBm and 9 dBm, and the power amplifier 38 operates more efficiently for a power range between 10 dBm and −1 dBm.

Figure 7:
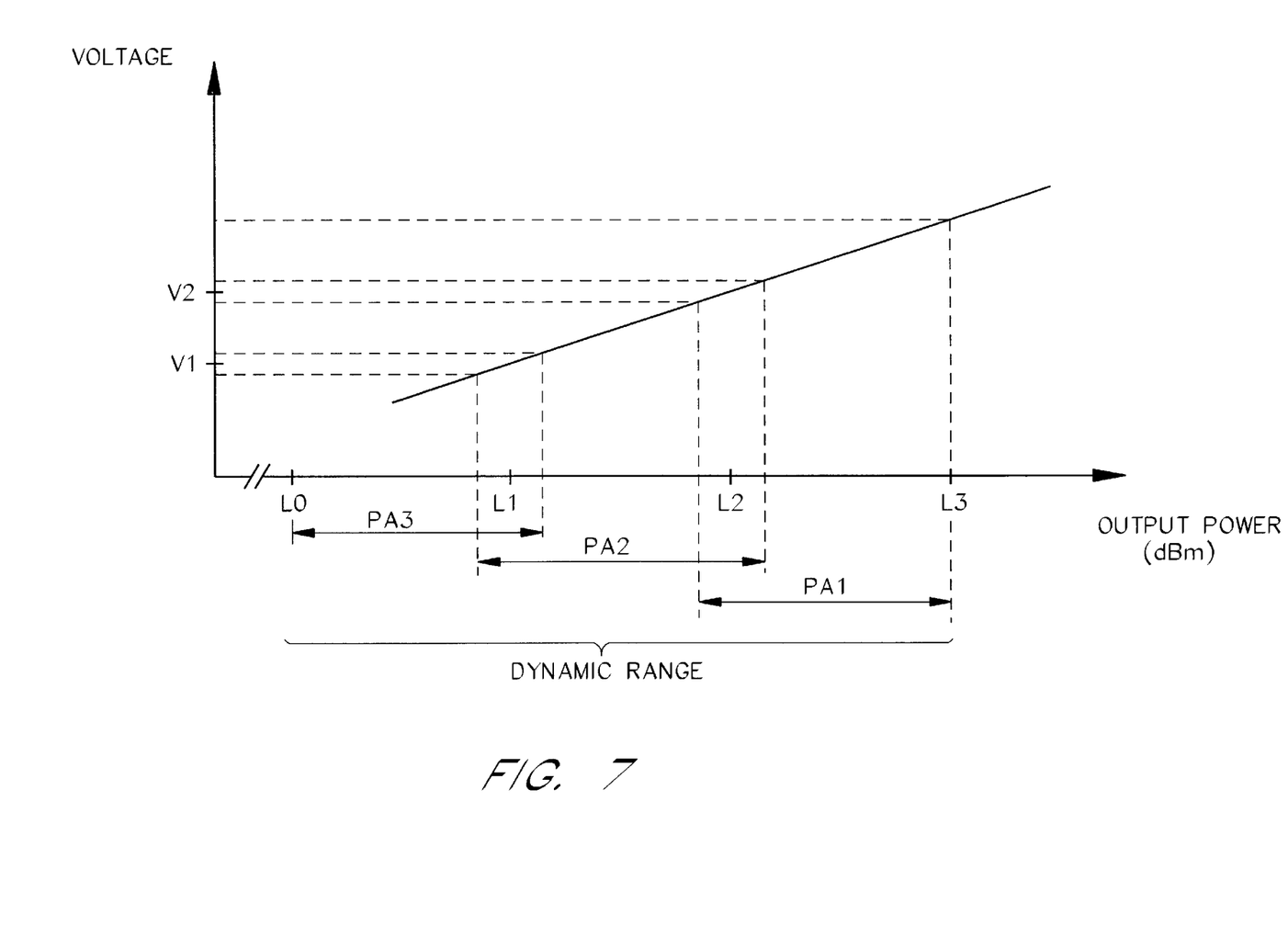
FIG. 7 shows a graph illustrating an embodiment of a hysteresis function.

FIG. 7 is a graph illustrating the DC voltage applied to an active power amplifier 34, 36, 38, or to the amplifier module 10 when only the selected power amplifier 34, 36, 38 is powered-up, as a function of the output power in dBm. In the illustrated embodiment, the output power covers a dynamic range between the power levels L0–L3. The power amplifiers 36, 38 (PA3, PA2) overlap within a range around the power level L1, and the power amplifiers 34, 36 (PA2, PA1) overlap within a range around the power level L2.

The output power corresponds to a voltage which a threshold detector compares with a preset threshold voltage. For instance, when the power amplifier 38 is active and the output power increases, the voltage corresponding to the power level L1 exceeds a threshold voltage V1. The controller 17 deactivates the power amplifier 38 and activates the power amplifier 36. Correspondingly, when the power amplifier 36 is active and the power decreases, at the threshold voltage V1, the power amplifier 38 is activated. A similar switching between the power amplifiers 34, 36 occurs at a threshold voltage V2 and the power level L2.

In one embodiment of the amplifier module 10, each power amplifier 34, 36, 38 covers a predetermined range of output power. The power ranges are selected so that neighboring power ranges of the power amplifiers 34, 36, 38 overlap by approximately 1 dBm. In this case, a hysteresis exists for switching between the power amplifiers 34, 36, 38. The hysteresis can be selected based on requirements for the design of the mobile communications system, for example, to avoid inadvertent switching.

The threshold detector, advantageously implemented in the controller 17, determines the power level at which a switching from one power amplifier to the next power amplifier is necessary. The hysteresis ensures, whenever a switching occurs, that the RF signal is amplified by a power amplifier which operates more efficiently at the present power level of the RF signal.

As described above, the controller 17 controls the power level with which the RF signal has to be transmitted. The controller 17 determines which power amplifier 34, 36, 38 is efficient at the presently required power level, and activates the corresponding power amplifier 34, 36, 38 until the power level requirement changes. As soon as the power level requirement changes, the controller 17 immediately activates the power amplifier 34, 36, 38 which is efficient for this power level. The switching between the power amplifiers 34, 36, 38 occurs so that the user of the phone 3 does not typically notice the switching.

Figure 8:
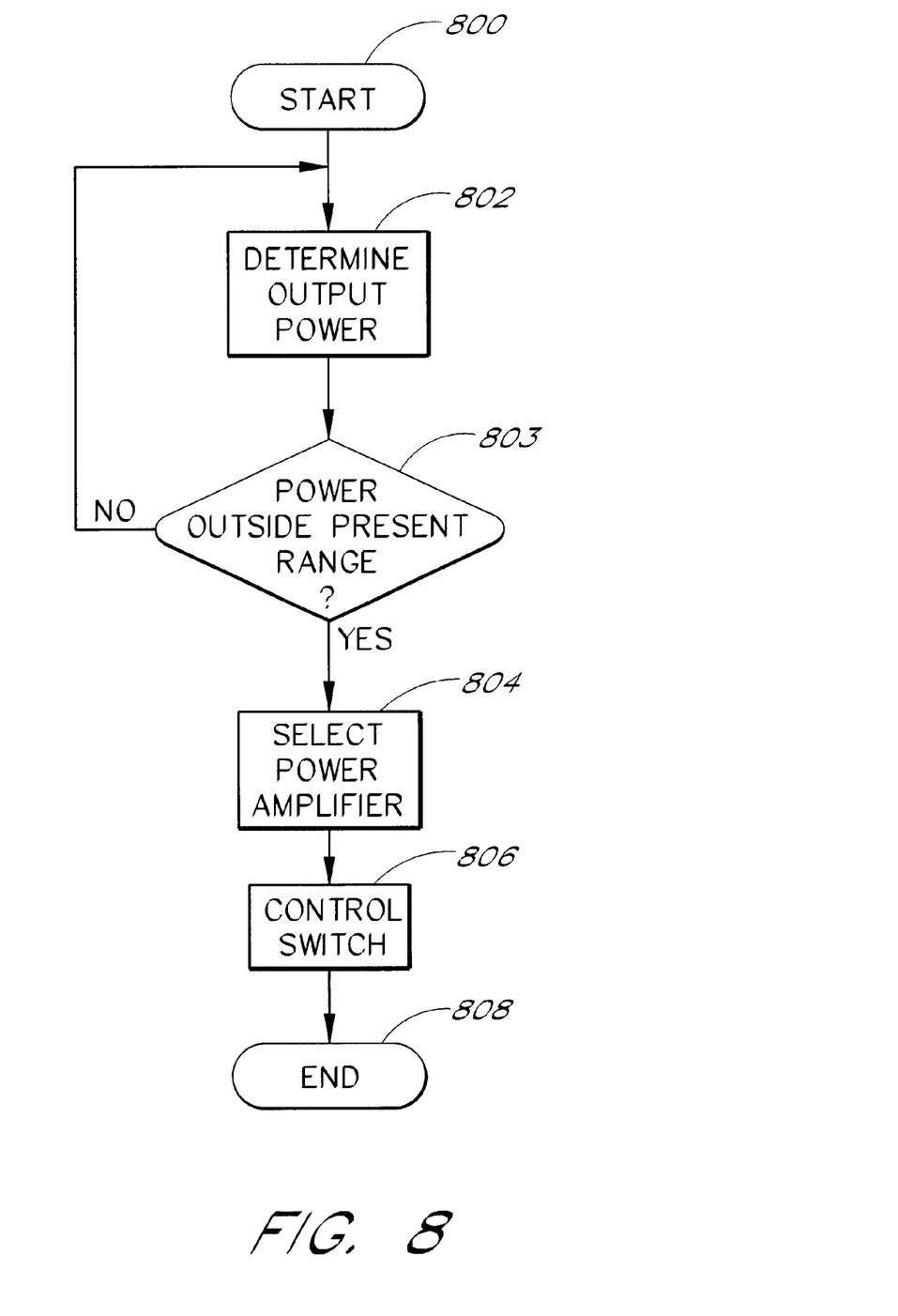
FIG. 8 shows a flow chart of a control procedure.

FIG. 8 shows a flow chart of a control procedure for the amplifier module 10. At power up of the phone 3, the procedure is reset and initialized, as represented in start block 800.

Proceeding to step 802, the procedure determines the output power at which the phone 3 currently emits the RF signals. As described above, the output power is determined, inter alia, by the distance between the phone 3 and the transceiver station. The controller 17 or the phone's CPU processes a signal, for example, received from the transceiver station which requires the phone 3, for example, to decrease the output power for about 5 dBm.

Proceeding to step 803, the procedure compares the determined output power in step 802 with the power range of the currently active power amplifier 34, 36, 38. If the determined output power is within the power range of the active power amplifier 34, 36, 38, the procedure proceeds along the NO branch back to step 802. If the determined output power is outside the power range of the active power amplifier 34, 36, 38, the procedure proceeds along the YES branch to step 804.

Proceeding to step 804, the procedure uses the signal indicating the 5-dBm decrease to correlate the "new" output power with power-efficiency data. The power-efficiency data links the new output power to one of the power amplifiers 34, 36, 38 which is efficient for the new output power so that the power efficiency of the phone 3 is increased.

Proceeding to step 806, the procedure controls the switch 40 to select the power amplifier 34, 36, 38 determined in step 704 and to connect this power amplifier 34, 36, 38 to the antenna 2. When the switch 40 is set, the procedure ends as indicated in block 708.

While the above detailed description has shown, described and identified several novel features of the invention as applied to a preferred embodiment, it will be understood that various omissions, substitutions and changes in the form and details of the described embodiments may be made by those skilled in the art without departing from the spirit of the invention. Accordingly, the scope of the invention should not be limited to the foregoing discussion, but should be defined by the appended claims.

What is claimed is:

1. A wireless communication device comprising:
   a modulator module configured to convert a baseband signal to a radio frequency signal;
   an amplifier module which receives the radio signal and generates an amplified output signal, the amplifier module comprising:
      a first amplifier in communication with the radio frequency signal, the first amplifier configured to generate a first amplified signal at increased power efficiency in a first operational power range, the first amplifier comprising a fourth amplifier and a fifth amplifier, the fifth amplifier arranged in series with the fourth amplifier;
      a second amplifier in communication with the radio frequency signal, the second amplifier arranged in parallel with the first amplifier, the second amplifier configured to generate a second amplified signal at increased power efficiency in a second operational power range, wherein the second operational power range is different than the first operational power range, and wherein the first operational power range and the second operational power range overlap to provide a hysteresis;
      a third amplifier in communication with the radio frequency signal, the third amplifier arranged in parallel with the first and second amplifiers, the third amplifier configured to generate a third amplified signal at increased power efficiency in a third operational power range, wherein the third operational power range is different than the first and second operational power ranges, and wherein the second operational power range and the third operational power range overlap to provide the hysteresis;
      a switch in communication with the first, second, and third amplifiers, the switch configured to select the first, second or third amplified signal as the amplified output signal; and
      a selector in communication with the first, second, and third amplifiers, the selector configured to selectively activate the first, second or third amplifier; and
   a control module in communication with the switch and the selector, wherein the control module processes a signal to change an output power level, the control module comprising:
      a threshold detector configured to detect a voltage applied to the amplifier module; and
      a preset threshold voltage comprising an upper threshold and a lower threshold to provide the hysteresis, wherein the control module is configured to control the switch and the selector based on a comparison of the voltage and the preset threshold voltage, the hysteresis, and as a function of the signal to change the output power level so that a power efficiency of the amplifier module is improved over a predetermined range of output power.

2. The device of claim 1, wherein the first operational power range is between 29 dBm and 19 dBm.

3. The device of claim 1, wherein the second operational power range is between 20 dBm and 9 dBm.

4. The device of claim 1, wherein the third operational power range is between 10 dBm and −1 dBm.

5. The device of claim 1 wherein the selector receives a digital control value.

6. The device of claim 5 wherein the control value identifies at least one of the first, second or third amplifiers.

7. An amplification module comprising:
an input for receiving an amplifier input signal;
at least a first amplifier in communication with the input, the first amplifier configured to amplify the input signal to generate a first amplified signal at increased output power efficiency within a first amplifier input range;
at least a second amplifier in communication with the input, the second amplifier arranged in parallel with the first amplifier, the second amplifier configured to amplify the input signal to generate a second amplified signal at increased output power efficiency within a second amplifier input range, wherein the second amplifier input range is different than the first amplifier input range, and wherein the first amplifier input range and the second amplifier input range overlap to provide a hysteresis; and
a switch in communication with the first and second amplifiers, the switch configured to output at least one of the first and second amplified signals as an amplified output signal, wherein the switch is controlled as a function of an output power level change, a voltage applied at the input of the amplification module, a predetermined threshold value comprising an upper threshold and a lower threshold to provide the hysteresis, and the hysteresis so that a power efficiency of the amplification module is improved over a range of output power.

8. The amplification module of claim 7 wherein the first and second amplifiers are configured to be selectively activated.

9. The amplification module of claim 7 wherein the first amplifier operates with increased power efficiency for an operational power range between 29 dBm and 19 dBm.

10. The amplification module of claim 7 wherein the second amplifier operates with increased power efficiency for an operational power range between 20 dBm and 9 dBm.

11. The amplification module of claim 7 wherein the switch selects either the first or second amplified signal.

12. The amplification module of claim 7 wherein the switch combines the first and second amplified signals.

13. The amplification module of claim 7 further comprising a selector, the selector configured to at least enable or disable at least one of the first or second amplifiers.

14. The amplification module of claim 7, further comprising at least a third amplifier in communication with the input, the third amplifier arranged in parallel with the first and second amplifiers, the third amplifier configured to amplify the input signal to generate a third amplified signal at increased output power efficiency within a third amplifier input range, wherein the third amplifier input range is different than the first and second amplifier input ranges and wherein the second amplifier input range and the third amplifier input range overlap to provide the hysteresis.

15. An amplifier circuit comprising:
an input for receiving an input signal;
at least a first amplifier in communication with the input, the first amplifier configured to amplify the input signal to generate a first amplified signal at increased power efficiency within a first operational power range;
at least a second amplifier in communication with the input, the second amplifier arranged in parallel with the first amplifier, the second amplifier configured to amplify the input signal to generate a second amplified signal at increased power efficiency within a second operational power range, wherein the second operational power range is different than the first operational power range, and wherein the first operational power range and the second operational power range overlap to provide a hysteresis; and
a selector in communication with the first and second amplifiers, the selector configured to enable at least one of the first and second amplifiers so as to generate an amplified output signal as a function of a signal to change an output power level, a voltage applied to the amplifier circuit, a preset threshold voltage comprising an upper threshold and a lower threshold to provide the hysteresis, and the hysteresis so that a power efficiency of the amplifier circuit is improved over a range of output power.

16. The amplifier circuit of claim 15 wherein the input signal is approximately 800 megahertz.

17. The amplifier circuit of claim 15 wherein the input signal is approximately 1900 megahertz.

18. The amplifier circuit of claim 15 wherein the amplified output signal is a wireless communications signal.

19. The amplifier circuit of claim 15 wherein the amplified output signal is a CDMA communications signal.

20. The amplifier circuit of claim 15 wherein the amplified output signal is a GSM communications signal.

21. The amplifier circuit of claim 15 wherein the amplified output signal is a PCS communications signal.

22. The amplifier circuit of claim 15 wherein the amplified output signal is an AMPS communications signal.

23. An amplifier circuit comprising:
a first means for amplifying an input signal to generate a first amplified signal at increased power efficiency within a first operational power range;
a second means arranged generally parallel with the first means, the second means for amplifying the input signal to generate a second amplified signal at increased power efficiency within a second operational power range, wherein the second operational power range is different than the first operational power range, and wherein the second operational power range overlaps the first operational power range to provide a hysteresis;
a third means for selectively enabling an output of at least one of the first or second amplified signals as a function of a voltage applied to the amplifier circuit, a preset threshold voltage comprising an upper threshold and a lower threshold to provide the hysteresis, the hysteresis, and a signal to change an output power level so that a power efficiency of the amplifier circuit is improved over a range of output power.

24. The amplifier circuit of claim 23 further comprising a fourth means for selectively enabling at least one of the first or second means for amplifying.

25. The amplifier circuit of claim 24 further comprising a fifth means for controlling the fourth means, the fifth means for controlling the enabling of at least one of the first and second means for amplifying based on a desired operational.

26. A method of operating a wireless communications device comprising the acts of:

converting a baseband signal to a radio frequency signal;

receiving the radio frequency signal as an amplifier input signal;

amplifying with a first amplifier, the amplifier input signal at increased power efficiency in a first operational power range to produce a first amplified signal;

amplifying with a second amplifier, the amplifier input signal at increased power efficiency in a second operational power range to produce a second amplified signal, the second amplifier arranged in parallel with the first amplifier, wherein the second operational power range is different than the first operational power range, and wherein the first operational power range and the second operational power range overlap to provide a hysteresis;

amplifying with a third amplifier, the amplifier input signal at increased power efficiency in a third operational power range to produce a third amplified signal, the third amplifier arranged in parallel with the first and second amplifiers, wherein the third operational power range is different than the first and second operational power ranges, and wherein the second operational power range and the third operational power range overlap to provide the hysteresis; and selectively outputting at least one of the first, second and third amplified signals as an amplified output signal, wherein the selectively outputting is based on an output power level change, a voltage applied to the first, second, and third amplifier, a preset threshold voltage comprising an upper threshold and a lower threshold to provide the hysteresis, and the hysteresis so that a power efficiency of the wireless communication device is improved over a predetermined range of output power.

27. The method of claim 26 wherein the first operational power range is between 29 dBm and 19 dBm.

28. The method of claim 26 wherein the second operational power range is between 20 dBm and 9 dBm.

29. The method of claim 26 wherein the third operational power range is between 10 dBm and −1 dBm.

30. The method of claim 26 further comprising the act of selectively activating the first, second or third amplifier.

31. The method of claim 26 further comprising the act of processing a digital control value to selectively activate the first, second or third amplifier.

32. The method of claim 26 further comprising the act of processing the first amplified signal with a fourth amplifier to generate a modified first amplified signal.

33. A method of amplifying an input signal over a range of output power comprising the acts of:

receiving an amplifier input signal;

amplifying the input signal with a first amplifier to generate a first amplified signal at increased output power efficiency within a first amplifier input range;

amplifying the input signal with a second amplifier to generate a second amplified signal at increased output power efficiency within a second amplifier input range, the second amplifier arranged in parallel with the first amplifier, wherein the second amplifier input range is different than the first amplifier input range; and selectively enabling an output of at least one of the first and second amplified signals as a function of a change in an output power, a voltage applied to at least one of the first and second amplifiers, a preset threshold voltage comprising an upper threshold and a lower threshold to provide a hysteresis, and the hysteresis so that a power efficiency is improved over the range of output power.

34. The method of claim 33 further comprising the act of selectively activating at least one of the first and second amplifiers.

35. The method of claim 33 wherein a first operational power range is between 29 dBm and 19 dBm.

36. The method of claim 33 wherein a second operational power range is between 20 dBm and 9 dBm.

37. The method of claim 33 wherein the act of selectively enabling selects either the first or second amplified signal.

38. The method of claim 33 wherein the act of selectively enabling combines the first and second amplified signals.

39. A method of amplifying an input signal and generating an amplified output signal comprising the acts of:

receiving an input signal;

amplifying with a first amplifier, the input signal to generate a first amplified signal at increased power efficiency within a first operational power range;

amplifying with a second amplifier, the input signal to generate a second amplified signal at increased power efficiency within a second operational power range, the second amplifier arranged in parallel with the first amplifier, and wherein the first operational power range is different from the second operational power range, and wherein the first operational power range overlaps the second operational power range to provide a hysteresis;

receiving a signal to change an output power level;

comparing a voltage applied to at least one of the first and second amplifiers with a preset threshold voltage comprising an upper threshold and a lower threshold to provide the hysteresis, wherein the act of comparing produces a comparison; and selecting at least one of the first and second amplified signals so as to generate the amplified output signal as a function of the signal to change the output power level, the comparison, and the hysteresis so that a power efficiency is improved over a range of output power.

40. The method of claim 39 wherein the input signal is approximately 800 megahertz.

41. The method of claim 39 wherein the input signal is approximately 1900 megahertz.

42. The method of claim 39 wherein the amplified output signal is a wireless communications signal.

43. The method of claim 39 wherein the amplified output signal is a CDMA communications signal.

44. The method of claim 39 wherein the amplified output signal is a GSM communications signal.

45. The method of claim 39 wherein the amplified output signal is a PCS communications signal.

46. The method of claim 39 wherein the amplified output signal is an AMPS communications signal.

* * * * *